(12) United States Patent
Umezawa et al.

(10) Patent No.: US 10,593,691 B2
(45) Date of Patent: Mar. 17, 2020

(54) THREE-DIMENSIONAL NON-VOLATILE MEMORY DEVICE WITH CUT OFF TIME CONTROL

(71) Applicant: Toshiba Memory Corporation, Minato-ku (JP)

(72) Inventors: Yusuke Umezawa, Yokohama (JP); Daisuke Hagishima, Meguro (JP); Kazunori Harada, Nagareyama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/016,894

(22) Filed: Jun. 25, 2018

(65) Prior Publication Data
US 2019/0198517 A1    Jun. 27, 2019

(30) Foreign Application Priority Data
Dec. 25, 2017  (JP) ................. 2017-247978

(51) Int. Cl.
*H01L 27/11578*   (2017.01)
*H01L 27/11582*   (2017.01)
*H01L 27/1157*    (2017.01)
*G11C 16/04*      (2006.01)
*G11C 16/08*      (2006.01)

(52) U.S. Cl.
CPC .... *H01L 27/11578* (2013.01); *G11C 16/0483* (2013.01); *G11C 16/08* (2013.01); *H01L 27/1157* (2013.01); *H01L 27/11582* (2013.01); *G11C 16/0466* (2013.01)

(58) Field of Classification Search
CPC .......... H01L 27/11578; H01L 27/1157; H01L 27/11568; H01L 27/11529; H01L 27/11582; H01L 27/11565; H01L 27/11575; H01L 27/115
See application file for complete search history.

(56) References Cited

U.S. PATENT DOCUMENTS

| | | | |
|---|---|---|---|
| 5,781,478 A | 7/1998 | Takeuchi et al. | |
| 9,929,174 B1 * | 3/2018 | Mizutani | H01L 27/1157 |
| 2017/0084624 A1 * | 3/2017 | Lee | H01L 27/11582 |
| 2018/0122742 A1 * | 5/2018 | Ha | H01L 23/535 |
| 2019/0043830 A1 * | 2/2019 | Sakakibara | H01L 25/0657 |

FOREIGN PATENT DOCUMENTS

| | | |
|---|---|---|
| JP | 9-139483 | 5/1997 |
| JP | 11-86571 | 3/1999 |
| JP | 3400214 | 4/2003 |

* cited by examiner

*Primary Examiner* — Allen L Parker
*Assistant Examiner* — Gustavo G Ramallo
(74) *Attorney, Agent, or Firm* — Oblon, McClelland, Maier & Neustadt, L.L.P.

(57) ABSTRACT

According to one embodiment, selection gates include an extract portion, a first portion, and a second portion. A predetermined potential is transmitted from the extract portion to the first portion. The predetermined potential is transmitted from the extract portion to the second portion with a delayed time to the first portion. A threshold voltage of a first selection transistor is different from a threshold voltage of a second selection transistor. The first selection transistor includes a semiconductor body disposed in the first portion as a channel. The second selection transistor includes the semiconductor body disposed in the second portion as a channel.

19 Claims, 5 Drawing Sheets

THREE-DIMENSIONAL NON-VOLATILE MEMORY DEVICE WITH CUT OFF TIME CONTROL

CROSS-REFERENCE TO RELATED APPLICATIONS

This application is based upon and claims the benefit of priority from Japanese Patent Application No. 2017-247978, filed on Dec. 25, 2017; the entire contents of which are incorporated herein by reference.

FIELD

Embodiments described herein relate generally to a semiconductor memory device.

BACKGROUND

A three-dimensional memory device has been proposed. The three-dimensional memory device includes a stacked body of multiple conductive layers including a word electrode layer and a selection gate layer. A memory cell including the word electrode layer as a control gate and a selection transistor including the selection gate layer as a control gate are connected in series in a stacking direction. The memory cell to be written is selected by the selection transistor.

DETAILED DESCRIPTION

According to one embodiment, a semiconductor memory device includes a stacked body, a plurality of semiconductor bodies, and a charge storage portion. The stacked body includes a plurality of conductive layers stacked with an insulator interposed. The conductive layers include a plurality of word electrode layers and at least one layer of selection gate layer provided above the word electrode layers. The semiconductor bodies extend in the stacked body in a stacking direction of the stacked body. The charge storage portion is provided between one of the semiconductor bodies and one of the conductive layers. The selection gate layer includes an extract portion, a first portion, and a second portion. A predetermined potential is transmitted from the extract portion to the first portion. The predetermined potential is transmitted from the extract portion to the second portion with a delayed time to the first portion. A threshold voltage of at least one of first selection transistors is different from a threshold voltage of at least one of second selection transistors. The first selection transistors include the semiconductor bodies disposed in the first portion as channels. The second selection transistors include the semiconductor bodies disposed in the second portion as channels.

Various embodiments will be described hereinafter with reference to the accompanying drawings. In the drawings, similar components are marked with like reference numerals, and a detailed description is omitted as appropriate. The drawings are schematic; and the relationships between the thickness and width of portions, the proportions of sizes among portions, etc., are not necessarily the same as the actual values thereof. Further, the dimensions and proportions may be illustrated differently among drawings, even for identical portions.

Figure 1:
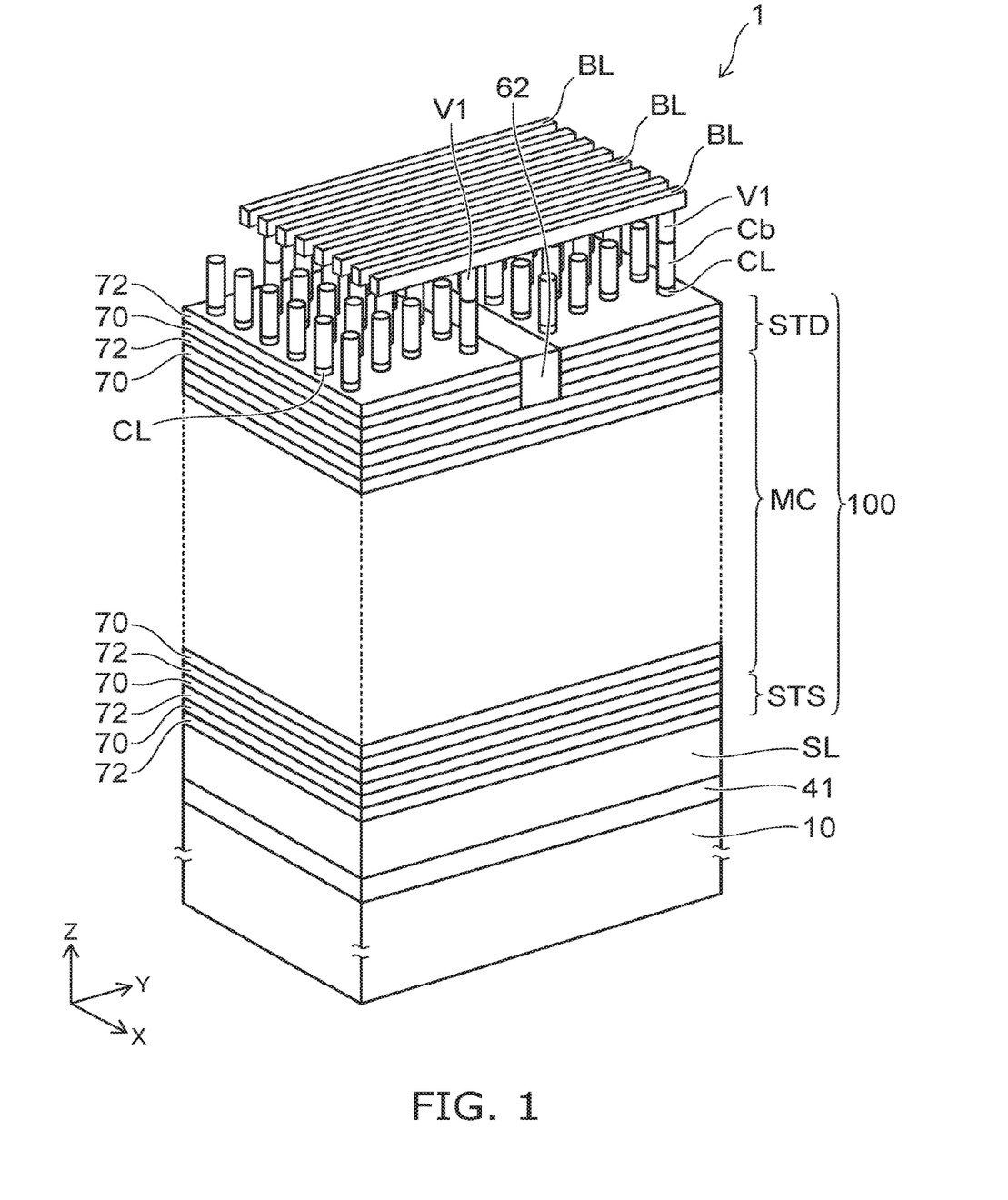
FIG. 1 is a schematic perspective view of a semiconductor memory device according to an embodiment of the invention.

FIG. 1 is a schematic perspective view of a memory cell array 1 of a semiconductor memory device according to an embodiment of the invention.

Figure 2A:
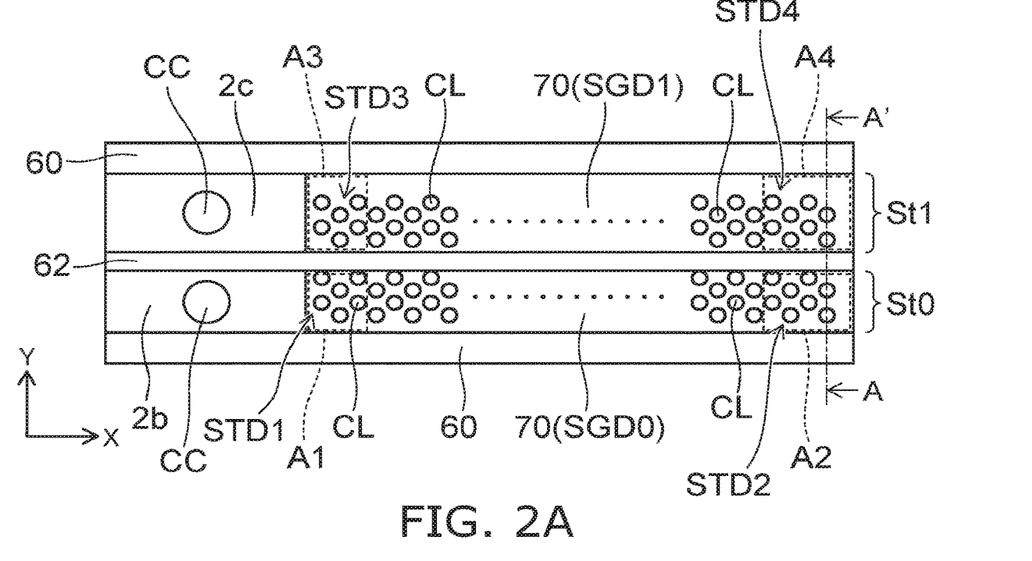
FIGS. 2A and 2B are schematic plan views of the semiconductor memory device according to the embodiment of the invention.
Figure 2B:
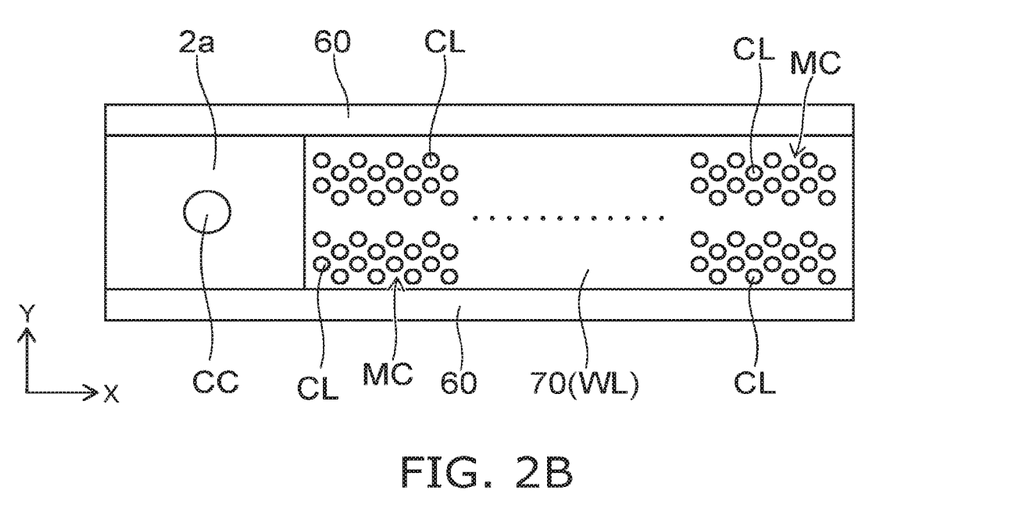

FIG. 2A is a schematic plan view of a selection gate layer, and FIG. 2B is a schematic plan view of a word electrode layer.

Figure 3:
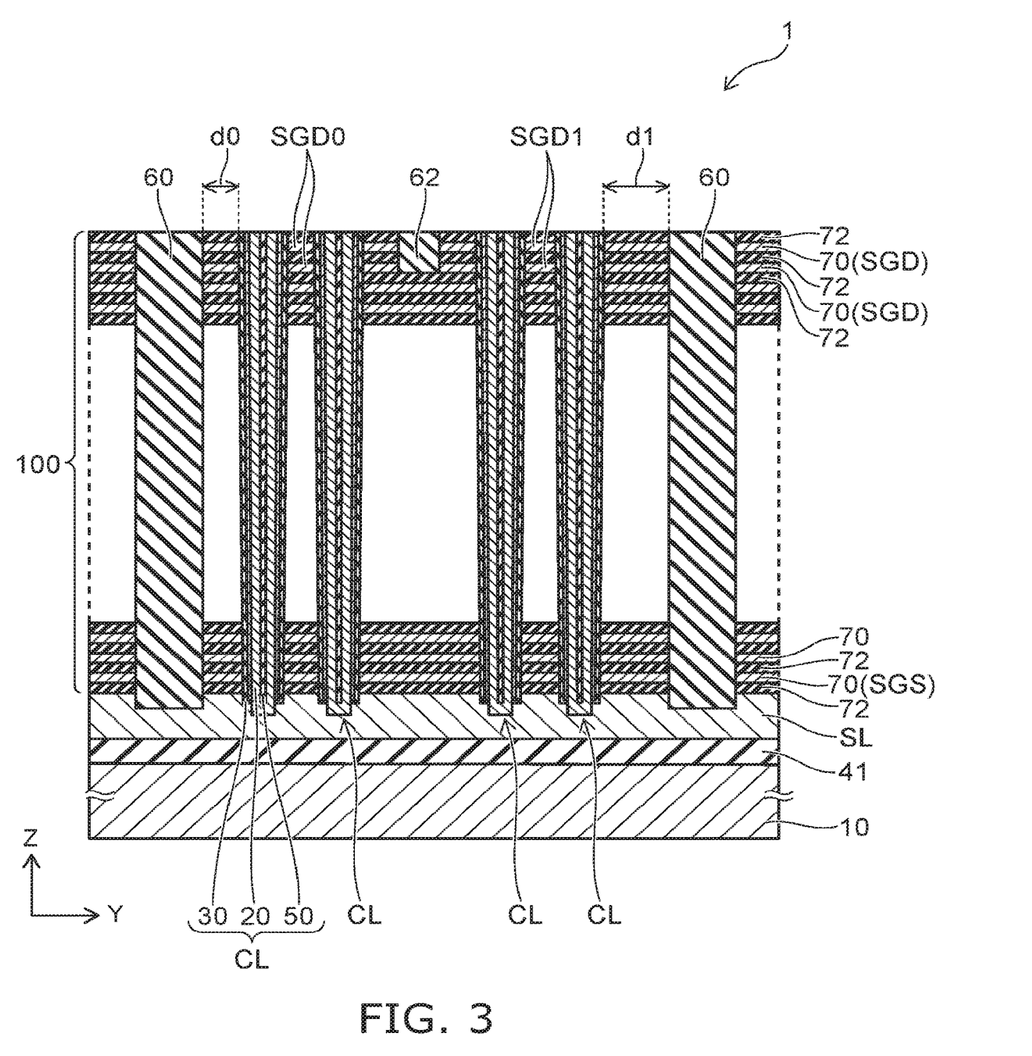
FIG. 3 is an A-A' line cross-sectional view in FIG. 2A.

FIG. 3 is an A-A' line cross-sectional view in FIG. 2A.

Figure 4:
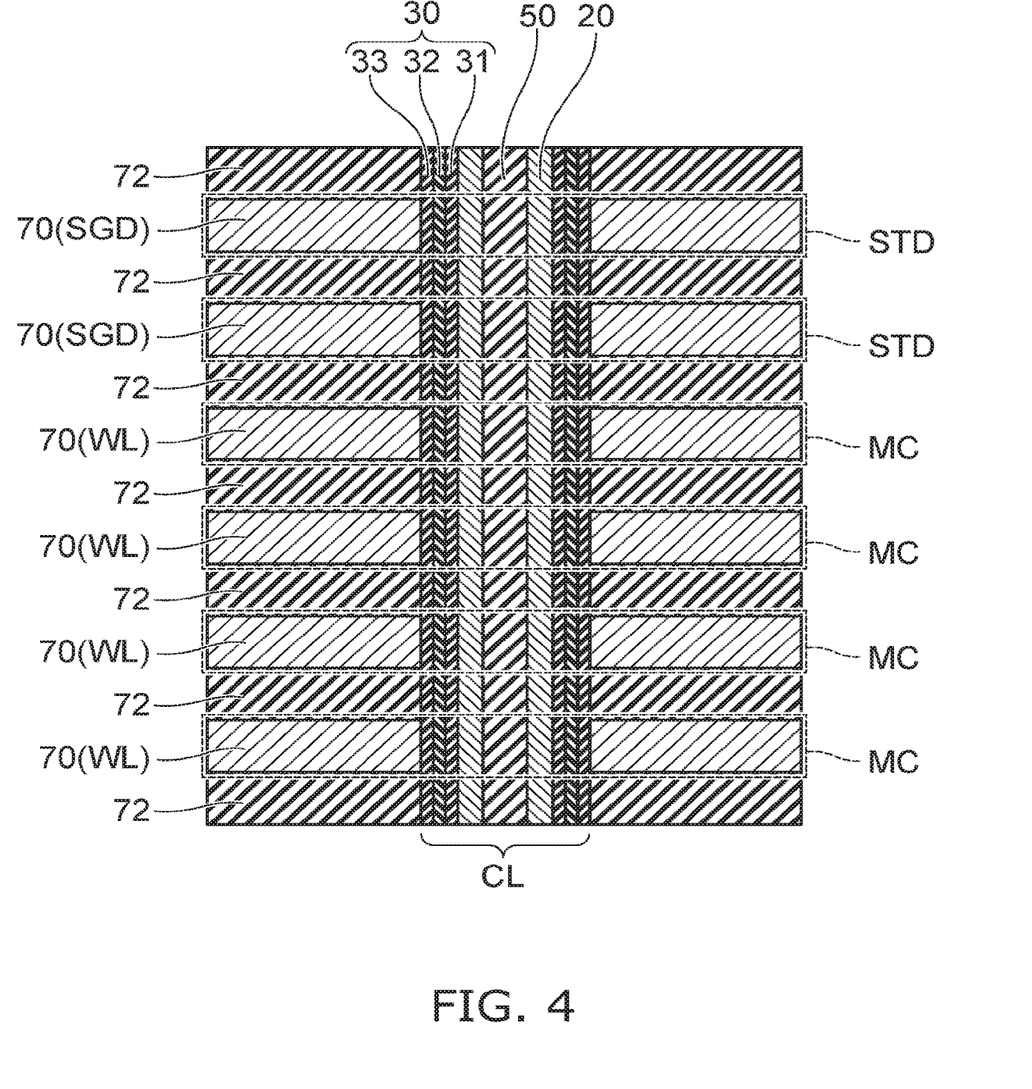
FIG. 4 is a schematic enlarged cross-sectional view of a portion in FIG. 3.

FIG. 4 is a schematic enlarged cross-sectional view of a portion in FIG. 3.

Figure 5:
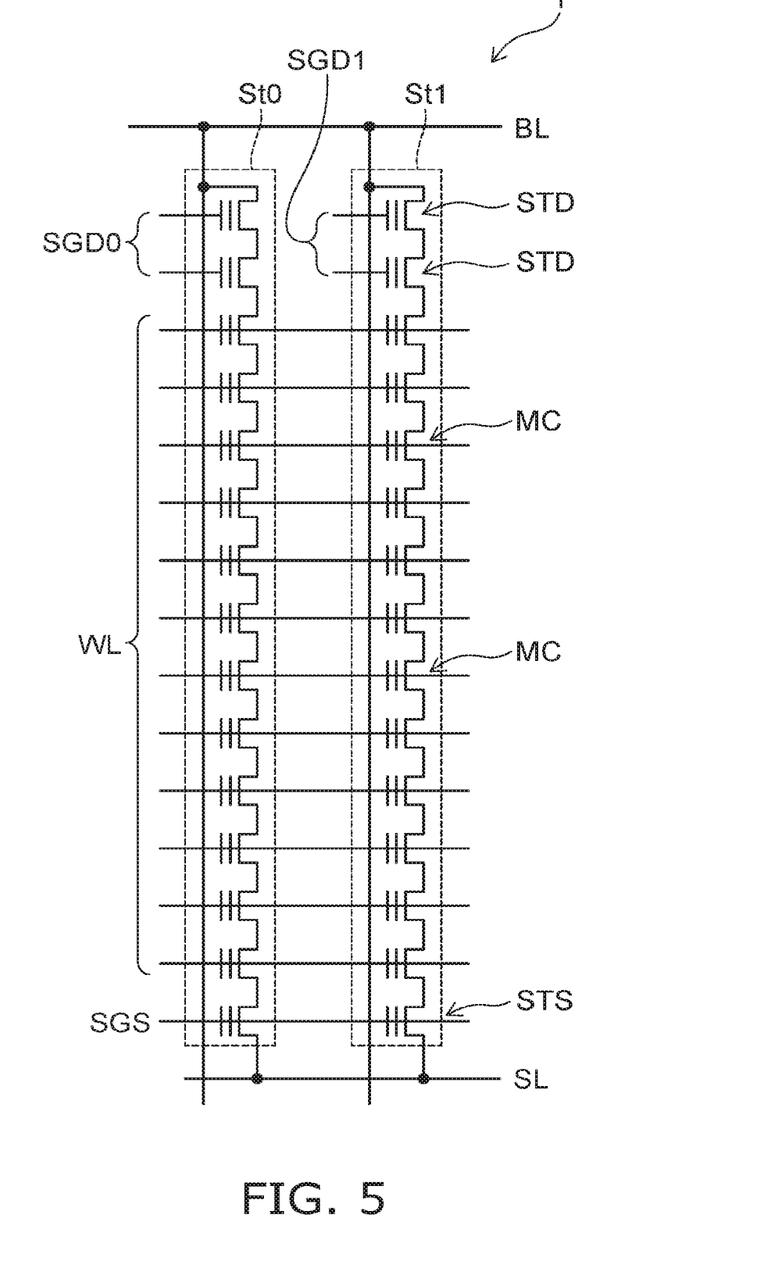
FIG. 5 is a circuit diagram of the semiconductor memory device according to the embodiment of the invention.

FIG. 5 is a circuit diagram of the memory cell array 1.

In FIG. 1, mutually orthogonal two directions parallel to a major surface of a substrate 10 are taken as an X-direction and a Y-direction, and a direction orthogonal to both of the X-direction and the Y-direction is taken as a Z-direction (stacking direction).

The memory cell array 1 includes the substrate 10, a stacked body 100, a source layer SL provided between the substrate 10 and the stacked body 100, multiple columnar portions CL, and multiple bit lines BL provided above the stacked body 100.

The substrate 10 is, for example, a silicon substrate. The source layer SL includes a semiconductor layer doped with an impurity, and further may include a layer including a metal. An insulating layer 41 is provided between the substrate 10 and the source layer SL.

As shown in FIG. 3, the stacked body 100 includes multiple conductive layers 70 stacked in the direction (Z-direction) perpendicular to the major surface of the substrate 10 with an insulating layer 72 interposed. The conductive layers 70 are, for example, metal layers. An insulating layer 72 is also provided between the source layer SL and the lower-most conductive layer 70. An insulator between the conductive layers 70 may be an air gap.

The stacked body 100 is separated into multiple blocks (or fingers) by a first separation portion 60. The first separation portion 60 extends in the stacking direction (Z-direction) and reaches the source layer SL. Furthermore, the first separation portion 60 extends in the X-direction, and separates the stacked body 100 into the multiple blocks in the Y-direction. The first separation portion 60 is, for example, an insulating film provided in a slit piercing the stacked body 100.

The columnar portions CL are formed in a substantially cylindrical configuration extending in the stacking direction (Z-direction) in the stacked body 100. The columnar portions CL pierce the stacked body 100 and reach the source layer SL. The multiple columnar portions CL are arranged in a staggered configuration. Alternatively, the multiple columnar portions CL may be arranged in a square lattice configuration.

Multiple bit lines BL are metal films extending in the Y-direction as shown in FIG. 1. The multiple bit lines BL are mutually separated in the X-direction.

FIG. 4 is a schematic enlarged cross-sectional view of a portion in FIG. 3.

The columnar portions CL include a memory film 30, a semiconductor body 20, and an insulative core film 50. The semiconductor body 20 is formed in a pipe configuration. The core film 50 is provided inside the semiconductor body 20. The memory film 30 is provided between the conductive layers 70 and the semiconductor body 20, and surrounds the semiconductor body 20.

The semiconductor body 20 is, for example, a silicon film. A lower end part of the semiconductor body 20 contacts the source layer SL as shown in FIG. 3. An upper end part of the semiconductor body 20 is connected to one of the bit lines BL via a contact Cb and a contact V1 as shown in FIG. 1.

As shown in FIG. 4, the memory film 30 is a stacked film including a tunnel insulating film 31, a charge storage film (charge storage portion) 32, and a block insulating film 33. The block insulating film 33, the charge storage film 32, and the tunnel insulating film 31 are provided in this order from the conductive layers 70 side between the conductive layers 70 and the semiconductor body 20.

The semiconductor body 20, the memory film 30, and the conductive layers 70 constitute a memory cell MC. The multiple conductive layers 70 include multiple word electrode layers WL functioning as a control gate of the memory cell MC. The memory cell MC has a vertical transistor structure in which the word electrode layer WL surrounds the semiconductor body 20 with the memory film 30 interposed. In the memory cell MC of the vertical transistor structure, the semiconductor body 20 functions as a channel, and the charge storage film 32 functions as a data memory layer storing a charge injected from the semiconductor body 20.

The semiconductor memory device can ease and write data electrically freely, and is a non-volatile semiconductor memory device which can maintain memory contents even if a power source is turned off.

The memory cell MC is, for example, a charge trap-type memory cell. The charge storage film 32 has many trap sites trapping a charge in the insulative film. The charge storage film 32 includes, for example, a silicon nitride film. Alternatively, the charge storage film 32 may be a conductive floating gate surrounded by the insulator.

The tunnel insulating film 31 becomes a potential barrier when a charge is injected from the semiconductor body 20 into the charge storage film 32 or a charge stored in the charge storage film 32 is discharged into the semiconductor body 20. The tunnel insulating film 31 includes, for example, a silicon oxide film.

The block insulating film 33 prevents the charge stored in the charge storage film 32 from being discharged into the word electrode layers WL. The block insulating film 33 prevents the charge from back tunneling from the word electrode layers WL to the columnar portions CL.

The block insulating film 33 includes, for example, a silicon oxide film. Alternatively, the block insulating film 33 may be, for example, a stacked film of the silicon oxide film and the metal oxide film.

As shown in FIG. 1, a drain side selection transistor STD is provided in an upper layer part of the stacked body 100, and a source side selection transistor STS is provided in a lower layer part of the stacked body 100.

At least uppermost conductive layer 70 of the multiple conductive layers 70 functions as a control gate (drain side selection gate) of the drain side selection transistor STD, and at least lowermost conductive layer 70 of the multiple conductive layers 70 functions as a control gate (source side selection gate) of the source side selection transistor STS.

The memory film 30 shown in FIG. 4 is provided also between the drain side selection gate and the semiconductor body 20, and between the source side selection gate and the semiconductor body 20.

The drain side selection transistor STD has a structure similar to the memory cell MC, in which the drain side selection gate surrounds the semiconductor body 20 with the memory film 30 interposed. The source side selection transistor STS has a structure similar to the memory cell MC, in which the source side selection gate surrounds the semiconductor body 20 with the memory film 30 interposed.

The semiconductor body 20 pierces the multiple conductive layers 70 including the word electrode layers WL and the selection gate layer. The multiple memory cells MC are provided between the drain side selection transistor STD and the source side selection transistor STS. The multiple memory cells MC, the drain side selection transistor STD, and the source side selection transistor STS are connected in series through the semiconductor body 20 (channel). The multiple memory cells MC are provided three-dimensionally in the X-direction, the Y-direction, and the Z-direction.

The multiple conductive layers 70 include the multiple word electrode layers WL, at least one layer of a source side selection gate layer SGS provided between the word electrode layers WL and the source layer SL, and at least one layer of a drain side selection gate layer SGD provided above the word electrode layers WL.

A dummy conductive layer not functioning as a control gate of the memory cells MC and the selection transistor may be provided between the word electrode layers WL and the source side selection gate layer SGS, and between the word electrode layers WL and the drain side selection gate layer SGD.

In the example shown in FIG. 3, two drain side selection gate layers SGD are provided above the word electrode layers WL. The insulating layer 72 is provided between the two drain side selection gate layers SGD. The multiple source side selection gate layers SGS may also be provided.

The drain side selection gate layers SGD are separated into two drain side selection gates in the Y-direction by a second separation portion 62. The second separation portion 62 separates the drain side selection gate layers SGD into a first drain side selection gate SGD0 and a second drain side selection gate SGD1.

The second separation portion 62 pierces the two drain side selection gate layers SGD, and extends in the X-direction. The second separation portion 62 is, for example, an insulating film provided in the slit. The second separation portion 62 does not separate the word electrode layer WL of the memory cell MC.

The first drain side selection gate SGD0 and the second drain side selection gate SGD1 are electrically controlled independently. Multiple layers of the first drain side selection gates SGD0 are controlled at the same potential, and multiple layers of the second drain side selection gates SGD1 are controlled at the same potential.

Depending on the multiple drain side selection gates separated by the second separation portion 62, multiple strings may be divided on the circuit.

In the example shown in FIG. 5, a first string St0 includes the drain side selection transistor STD including the first drain side selection gate SGD0 as a control gate, the memory cell MC connected in series to this drain side selection transistor STD, and the source side selection transistor STS connected in series to this memory cell MC.

A second string St1 includes the drain side selection transistor STD including the second drain side selection gate SGD1 as a control gate, the memory cell MC connected in series to this drain side selection transistor STD, and the source side selection transistor STS connected in series to this memory cell MC.

As shown in FIG. 2A, the first string St0 includes the multiple columnar portions CL disposed in the first drain side selection gate SGD0, and the second string St1 includes the multiple columnar portions CL disposed in the second drain side selection gate SGD1.

The first drain side selection gate SGD0 and the second drain side selection gate SGD1 are disposed between the two parts of first separation portion 60 adjacent separated in the Y-direction. The second separation portion 62 is disposed between the first drain side selection gate SGD0 and the second drain side selection gate SGD1.

FIG. 2B shows an arbitrary one layer of the word electrode layer WL belonging to the two strings, and the word electrode layer WL is disposed between the two parts of first separation portions 60 adjacent separated in the Y-direction. A width in the Y-direction of the word electrode layer WL separated by the two parts of first separation portions 60 is larger than a width in the Y-direction of the first drain side selection gate SGD0, and larger than a width in the Y-direction of the second drain side selection gate SGD1.

The cell structure shown in FIG. 2B is stacked in multiple layers below the drain side structure shown in FIG. 2A. The drain side structure shown in FIG. 2A and the cell structure shown in FIG. 2B are repeated in the Y-direction. The multiple drain side selection gates (multiple strings) separated by the first separation portion 60 and the second separation portion 62 are arranged in the Y-direction. The multiple word electrode layers WL separated by the first separation portion 60 are arranged in the Y-direction.

The first drain side selection gate SGD0 includes an extract region 2b, a first region A1, and a second region A2. The extract region 2b is disposed at one end in the X-direction of the first drain side selection gate SGD0. The first region A1 is disposed between the extract region 2b and the second region A2.

The first region A1 is a region nearest to the extract region 2b of multiple regions arranged in the first drain side selection gate SGD0 in the X-direction. The second region A2 is a region farthest from the extract region 2b of the multiple regions.

The first region A1 includes the multiple columnar portions CL, and includes multiple first drain side selection transistors STD1. The first drain side selection transistor STD1 includes the semiconductor body 20 piercing the first drain side selection gate SGD0 of the first region A1 as a channel, and includes the first drain side selection gate SGD0 as a control gate.

The second region A2 includes the multiple columnar portions CL, and includes multiple second drain side selection transistors STD2. The second drain side selection transistor STD2 includes the semiconductor body 20 piercing the first drain side selection gate SGD0 of the second region A2 as a channel, and includes the first drain side selection gate SGD0 as a control gate.

The extract region 2b is connected to a not shown upper layer interconnection through a contact CC. The upper layer interconnection is connected to a control circuit. The control circuit is provided at a periphery of the memory cell array 1 or below the memory cell array 1. A predetermined gate potential is applied to the first drain side selection gate SGD0 through the control circuit, the upper layer interconnection, the contact CC, and the extract region 2b.

The second drain side selection gate SGD1 includes an extract region 2c, a third region A3, and a fourth region A4. The extract region 2c is disposed at one end in the X-direction of the second drain side selection gate SGD1. The third region A3 is disposed between the extract region 2c and the fourth region A4.

The third region A3 is a region nearest to the extract region 2c of multiple regions arranged in the second drain side selection gate SGD1 in the X-direction. The fourth region A4 is a region farthest from the extract region 2c of the multiple regions.

The third region A3 includes the multiple columnar portions CL, and includes multiple third drain side selection transistors STD3. The third drain side selection transistor STD3 includes the semiconductor body 20 piercing the second drain side selection gate SGD1 of the third region A3 as a channel, and includes the second drain side selection gate SGD1 as a control gate.

The fourth region A4 includes the multiple columnar portions CL, and includes multiple fourth drain side selection transistors STD4. The fourth drain side selection transistor STD4 includes the semiconductor body 20 piercing the second drain side selection gate SGD1 of the fourth region A4 as a channel, and includes the second drain side selection gate SGD1 as a control gate.

The extract region 2c is connected to a not shown upper layer interconnection through a contact CC. The upper layer interconnection is connected to a control circuit. The control circuit is provided at a periphery of the memory cell array 1 or below the memory cell array 1. A predetermined gate potential is applied to the second drain side selection gate SGD1 through the control circuit, the upper layer interconnection, the contact CC, and the extract region 2c.

The word electrode layer WL also includes an extract region 2a disposed at one end in the X-direction. The extract region 2a is connected to a not shown upper layer interconnection through a contact CC. The upper layer interconnection is connected to a control circuit. The control circuit is provided at a periphery of the memory cell array 1 or below the memory cell array 1. A predetermined gate potential is applied to the word electrode layer WL through the control circuit, the upper layer interconnection, the contact CC, and the extract region 2a.

The predetermined potential applied to the extract region 2b is transmitted to the whole region of the first drain side selection gate SGD0. A distance between the extract region 2b and the second region A2 is longer than a distance between the extract region 2b and the first region A1. Therefore, the predetermined potential is transmitted to the second region A2 from the extract region 2b with a delayed time to the first region A1.

The predetermined potential applied to the extract region 2c is transmitted to the whole region of the second drain side selection gate SGD1. A distance between the extract region 2c and the fourth region A4 is longer than a distance between the extract region 2c and the third region A3. Therefore, the predetermined potential is transmitted to the fourth region A4 from the extract region 2c with a delayed time to the third region A3.

A process of forming the first separation portion 60 includes forming a slit in the stacked body 100, and forming an insulating film in the slit. Because of variation of position of the slit when forming the slit, a distance (width) between the columnar portion CL nearest to the first separation portion 60 and the first separation portion 60 may vary in the drain side selection gate.

In the example shown in FIG. 2 and FIG. 3, a distance d1 between the first separation portion 60 and the columnar portion CL nearest to the first separation portion 60 of the multiple columnar portions CL in the second drain side selection gate SGD1 is larger than a distance d0 between the first separation portion 60 and the columnar portion CL nearest to the first separation portion 60 of the multiple columnar portions CL in the first drain side selection gate SGD0. A width in the Y-direction of the first drain side selection gate SGD0 is smaller than a width in the Y-direction of the second drain side selection gate SGD1. Because of a difference between the distances (width) d0, d1, a resistance of the first drain side selection gate SGD0 is higher than a resistance of the second drain side selection gate SGD1.

Because of the difference of the resistances of the drain side selection gates SGD0, SGD1, and the difference of the distances from the extract regions 2b, 2c previously described, the time during which the predetermined potential is transmitted from the extract region 2b to the second region A2 in the first drain side selection gate SGD0 is later than the time during which the predetermined potential is transmitted from the extract region 2c to the third region A3 in the second drain side selection gate SGD1.

Depending on the difference of the resistance between the first drain side selection gate SGD0 and the second drain side selection gate SGD1, the time during which the predetermined potential is transmitted from the extract region 2b to an arbitrary region of the first drain side selection gate SGD0 may be later than the time during which the predetermined potential is transmitted from the extract region 2c to an arbitrary region of the second drain side selection gate SGD1. For example, the time during which the predetermined potential is transmitted from the extract region 2b to the second region A2 in the first drain side selection gate SGD0 may be later than the time during which the predetermined time is transmitted from the extract region 2c to the fourth region A4 in the second drain side selection gate SGD1.

Next, the operation of writing data into the memory cell MC will be described.

At first, all drain side selection transistors in an arbitrary block including a selection cell to be written are turned on, and electrons in the semiconductor body (channel) 20 are extracted to the bit lines BL.

After that, a write potential Vpgm (for example, about 20V) is applied to the word electrode layer WL serving as a control gate of the selection cell. The potential of the bit line BL connected to the selection cell is set to, for example, 0V. Since the drain side selection transistor connected to the selection cell is on, the potential of the semiconductor body 20 of the selection cell is 0V. The electrons are injected into the charge storage film 32 of the selection cell by the potential difference between the word electrode layer WL and the semiconductor body 20.

A non-selection drain side selection transistor not connected to the selection cell to be written is cut off. The potential of the semiconductor body 20 connected to the non-selection drain side selection transistor is boosted to be in a floating state. The potential difference causing the electrons to be injected into the charge storage film 32 is not produced between the word electrode layer WL and the semiconductor body 20 of a non-selection cell.

Here, when the write potential Vpgm is applied to the word electrode layer WL of the selection cell, if the cut off of the non-selection drain side selection transistor connected to the non-selection cell including the word electrode layer WL applied with the potential Vpgm as a control gate is insufficient, the potential boost of the semiconductor body 20 of the non-selection cell is insufficient, and error writing may be caused, in which the electrons are injected into the charge storage film 32 of the non-selection cell.

Particularly, as described previously, cut off timing is delayed for the drain side selection transistor disposed in a region where transmission of the cut off potential (for example, 0V) from the extract region tends to be delayed in the drain side selection gate, and the error writing into the non-selection cell tends to occur.

According to the embodiment, threshold voltages of the multiple drain side selection transistors are not uniform, but the threshold voltages are changed depending on the region from the extract region and the distances (width) do, d1 shown in FIG. 3.

The threshold voltage of the second drain side selection transistor STD2 disposed in the second region A2 where the transmission delay tends to occur especially shown in FIG. 2A described previously is made higher than that of the drain side selection transistors in other regions, and thus the delay of the cut off timing of the second drain side selection transistor STD2 set to be non-selection when writing is suppressed.

In the example shown in FIG. 2A, at least the threshold voltage of the second drain side selection transistor STD2 disposed in the second region A2 is higher than the threshold voltage of the third drain side selection transistor STD3 disposed in the third region A3.

Alternatively, the threshold voltage of the second drain side selection transistor STD2 disposed in the second region A2 may be higher than the threshold voltage of the first drain side selection transistor STD1 disposed in the first region A1.

Furthermore, the threshold voltage of the second drain side selection transistor STD2 disposed in the second region A2 may be higher than the threshold voltage of the fourth drain side selection transistor STD4 disposed in the first region A4.

The threshold voltage of the drain side selection transistor in the region where the cut off timing tends to delay compared with other regions is made higher, and thus the delay of the cut off timing of the drain side selection transistor set to be non-selection when writing is suppressed, and boost deterioration of the semiconductor body of the non-selection cell can be suppressed. This reduces the possibility of error writing of the non-selection cell.

Margin deterioration of the selection gate can be suppressed to minimize by limiting regions where the threshold voltage is heightened.

The drain side selection transistor also includes the charge storage film 32 between the control gate and the semiconductor body 20 as well as the memory cell. For example, when die sorting before shipment, the electrons are injected into the charge storage film 32 of the drain side selection transistor, and the threshold voltage can be adjusted.

In the above example, at least, the amount of charge (electron) stored in the charge storage film 32 of the third drain side selection transistor STD3 is different from the amount of charge (electron) stored in the charge storage film 32 of the second drain side selection transistor STD2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
a stacked body including a plurality of conductive layers with an insulator interposed between adjacent pairs of conductive layers from the plurality of conductive layers, the conductive layers including a plurality of word electrode layers and at least one layer of selection gate layer provided above the word electrode layers;
a plurality of semiconductor bodies extending in the stacked body in a stacking direction of the stacked body;
a charge storage portion provided between one of the semiconductor bodies and one of the conductive layers;
a source layer provided below the stacked body; and
a plurality of bit lines provided above the stacked body, lower end parts of the semiconductor bodies being connected to the source layer, and upper end parts of the semiconductor bodies being connected to the bit lines,
the selection gate layer including an extract portion, a first portion, and a second portion, a predetermined potential is transmitted from the extract portion to the first portion, the predetermined potential is transmitted from the extract portion to the second portion with a delayed time to the first portion,
a threshold voltage of at least one of first selection transistors being different from a threshold voltage of at least one of second selection transistors, the first selection transistors including the semiconductor bodies disposed in the first portion as channels, the second selection transistors including the semiconductor bodies disposed in the second portion as channels.

2. The device according to claim 1, wherein
the threshold voltage of the at least one of second selection transistors is higher than the threshold voltage of the at least one of first selection transistors.

3. The device according to claim 1, wherein
a distance between the extract portion and the second portion is longer than a distance between the extract portion and the first portion.

4. The device according to claim 1, wherein
a charge amount stored in the charge storage portion of the at least one of first selection transistors is different from a charge amount stored in the charge storage portion of the at least one of second selection transistors.

5. A semiconductor memory device comprising:
a stacked body including a plurality of conductive layers with an insulator interposed between adjacent pairs of conductive layers from the plurality of conductive layers, the conductive layers including a plurality of word electrode layers and at least one layer of selection gate layer provided above the word electrode layers;
a plurality of semiconductor bodies extending in the stacked body in a stacking direction of the stacked body;
a charge storage portion provided between one of the semiconductor bodies and one of the conductive layers; and
a separation portion extending in a first direction, the separation portion separating at least the selection gate layer into a plurality of selection gates in a second direction crossing the first direction,
the selection gates including an extract portion, a first portion, and a second portion, a distance between the extract portion and the second portion being longer than a distance between the extract portion and the first portion,
a threshold voltage of at least one of second selection transistors being higher than a threshold voltage of at least one of first selection transistors, the first selection transistors including the semiconductor bodies disposed in the first portion as channels, the second selection transistors including the semiconductor bodies disposed in the second portion as channels.

6. The device according to claim 5, wherein
the extract portion is disposed at an end in the first direction of the selection gates.

7. The device according to claim 5, wherein
a charge amount stored in the charge storage portion of the at least one of first selection transistors is different from a charge amount stored in the charge storage portion of the at least one of second selection transistors.

8. A semiconductor memory device comprising:
a stacked body including a plurality of conductive layers with an insulator interposed between adjacent pairs of conductive layers from the plurality of conductive layers, the conductive layers including a plurality of word electrode layers, and at least one layer of selection gate layer provided above the word electrode layers;
a plurality of semiconductor bodies extending in the stacked body in a stacking direction of the stacked body;
a charge storage portion provided between one of the semiconductor bodies and one of the conductive layers;
a first separation portion extending in a first direction, the first separation portion separating the selection gate layer and the word electrode layers into a plurality of blocks in a second direction crossing the first direction; and
a second separation portion extending in the first direction, and separating the selection gate layer into a first selection gate and a second selection gate in the second direction,
a resistance of the first selection gate being different from a resistance of the second selection gate,
a threshold voltage of a first selection transistor being different from a threshold voltage of a second selection transistor, the first selection transistor including a first semiconductor body of the semiconductor bodies as a channel, the second selection transistor including a second semiconductor body of the semiconductor bodies as a channel, the first semiconductor body being disposed in the first selection gate and the second semiconductor body being disposed in the second selection gate.

9. The device according to claim 8, wherein
the resistance of the first selection gate is higher than the resistance of the second selection Elate, and
the threshold voltage of the first selection transistor is higher than the threshold voltage of the second selection transistor.

10. The device according to claim 9, wherein
a distance between the first separation portion and a semiconductor body being nearest to the first separation portion of the semiconductor bodies disposed in the second selection gate is larger than a distance between the first separation portion and a semiconductor body being nearest to the first separation portion of the semiconductor bodies disposed in the first selection gate.

11. The device according to claim 9, wherein
a width in the second direction of the first selection gate is smaller than a width in the second direction of the second selection gate.

12. The device according to claim 9, wherein
a width in the second direction of one of the word electrode layers is larger than a width in the second direction of the first selection gate, and a width in the second direction of the second selection gate.

13. The device according to claim 9, wherein
the first selection gate includes a first extract region, a first region, and a second region, a distance between the first extract region and the second region being longer than a distance between the first extract region and the first region,
the second selection gate includes a second extract region, a third region, and a fourth region, a distance between the second extract region and the fourth region being longer than a distance between the second extract region and the third region, and
the first selection transistor includes a transistor disposed in the second region.

14. The device according to claim 13, wherein
the second selection transistor includes a transistor disposed in the fourth region, the second region and the fourth region being disposed in the second direction.

15. The device according to claim 14, wherein
a threshold voltage of the transistor disposed in the second region is higher than a threshold voltage of the transistor disposed in the fourth region, and higher than a threshold voltage of a transistor disposed in the first region.

16. The device according to claim 13, wherein
the first extract region is disposed at an end in the first direction of the first selection gate, and
the second extract region is disposed at an end in the first direction of the second selection gate.

17. The device according to claim 8, further comprising:
a source layer provided below the stacked body; and
a plurality of bit lines provided above the stacked body,
lower end parts of the semiconductor bodies being connected to the source layer, and upper end parts of the semiconductor bodies being connected to the bit lines.

18. The device according to claim 8, wherein
the first selection gate and the second selection gate are disposed between two parts of the first separation portion, and
the second separation portion is disposed between the first selection gate and the second selection gate.

19. The device according to claim 8, wherein
a charge amount stored in the charge storage portion of the first selection transistor is different from a charge amount stored in the charge storage portion of the second selection transistor.

* * * * *